US010976878B2

(12) United States Patent
Tada et al.

(10) Patent No.: US 10,976,878 B2
(45) Date of Patent: Apr. 13, 2021

(54) DISPLAY DEVICE

(71) Applicant: Japan Display Inc., Tokyo (JP)

(72) Inventors: Yusuke Tada, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/776,644

(22) Filed: Jan. 30, 2020

(65) Prior Publication Data

US 2020/0167042 A1 May 28, 2020

Related U.S. Application Data

(63) Continuation of application No. PCT/JP2018/021533, filed on Jun. 5, 2018.

(30) Foreign Application Priority Data

Aug. 14, 2017 (JP) .............................. JP2017-156445

(51) Int. Cl.
  *G06F 3/044* (2006.01)
  *G06F 3/041* (2006.01)
  *H01L 27/32* (2006.01)
(52) U.S. Cl.
  CPC .......... *G06F 3/0443* (2019.05); *G06F 3/0412* (2013.01); *G06F 3/0446* (2019.05); *H01L 27/323* (2013.01); *H01L 27/3244* (2013.01)
(58) Field of Classification Search
  CPC . H01L 27/3216; H01L 27/3244; H01L 33/24; G06F 3/0443
  See application file for complete search history.

(56) References Cited

U.S. PATENT DOCUMENTS

2014/0183572 A1* 7/2014 Kim .................... H01L 25/0753
  257/88
2014/0183573 A1* 7/2014 Kim ....................... H01L 33/08
  257/88

(Continued)

FOREIGN PATENT DOCUMENTS

JP        2016-081529 A       5/2016

OTHER PUBLICATIONS

International Search Report dated Aug. 28, 2018 for the PCT application No. PCT/JP2018/021533, with partial English translation.

(Continued)

*Primary Examiner* — Gerald Johnson
(74) *Attorney, Agent, or Firm* — Michael Best & Friedrich LLP

(57) ABSTRACT

A display device in an embodiment includes a first light emitting region; a second light emitting region located at a position away from the first light emitting region by a first distance in a first direction; a third light emitting region located at a position away from the second light emitting region by a second distance shorter than the first distance in the first direction; a first conductive portion located between the first light emitting region and the second light emitting region as seen from a display plane, the first conductive portion having a first width in the first direction, and a second conductive portion located between the second light emitting region and the third light emitting region as seen from the display plane, the second conductive portion having a second width shorter than the first width in the first direction.

9 Claims, 8 Drawing Sheets

(56) References Cited

U.S. PATENT DOCUMENTS

2016/0109998 A1    4/2016  Watanabe
2018/0157357 A1*   6/2018  Lin ..................... H01L 27/1222

OTHER PUBLICATIONS

Written Opinion of the International Searching Authority dated Aug. 28, 2018 for the PCT application No. PCT/JP2018/021533.

* cited by examiner

FIG.2
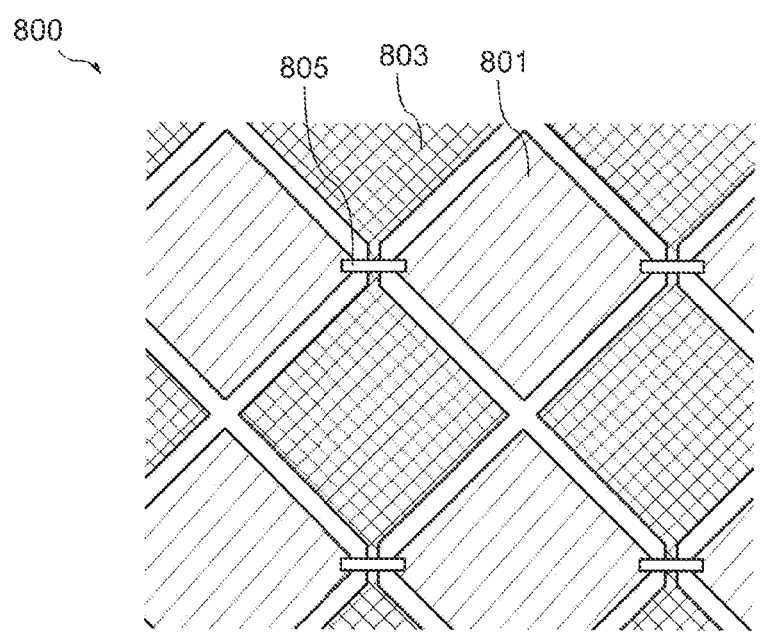
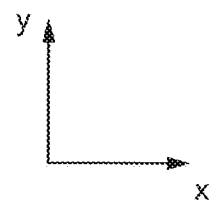

FIG.8
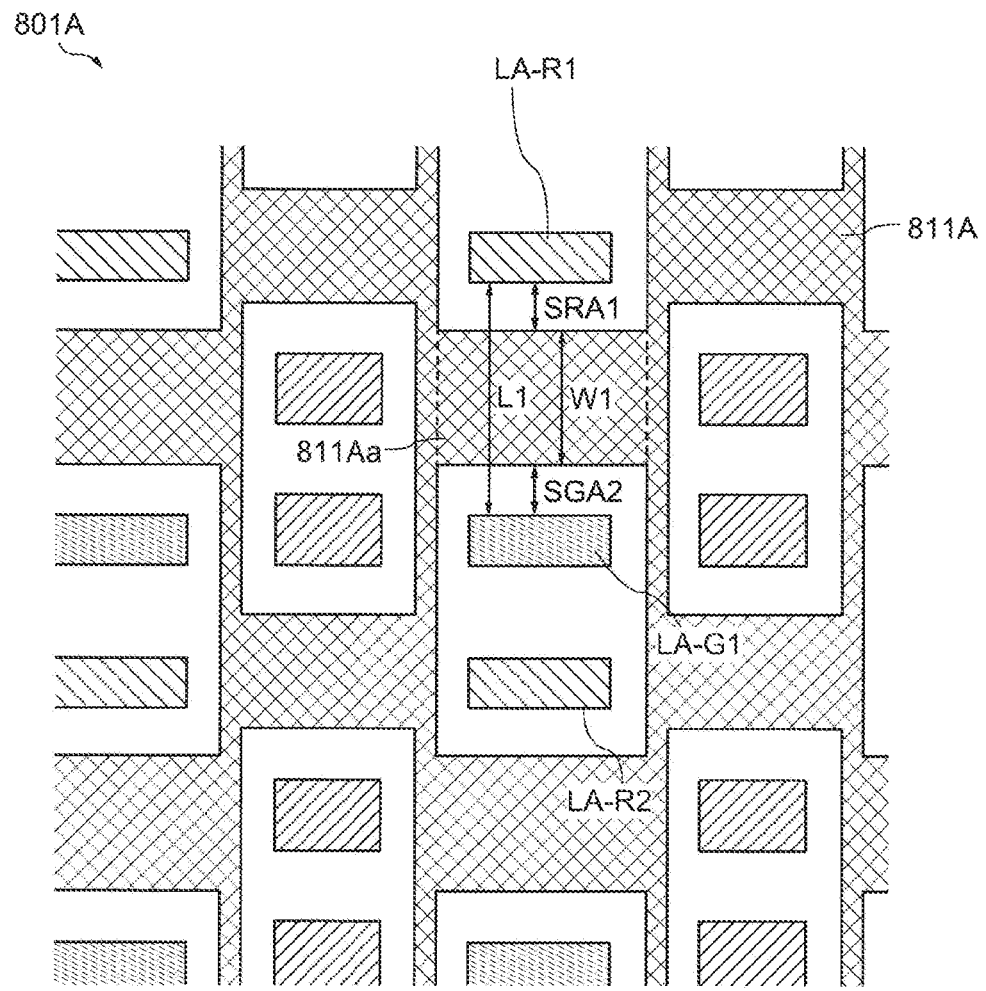
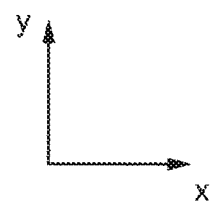

DISPLAY DEVICE

CROSS REFERENCE TO RELATED APPLICATIONS

This application is based on and claims the benefit of priority from the prior Japanese Patent Application No. 2017-156445, filed on Aug. 14, 2017, and PCT Application No. PCT/JP2018/021533 filed on Jun. 5, 2018, the entire contents of which are incorporated herein by reference.

FIELD

The present invention relates to a display device.

BACKGROUND

A display device included in a mobile electronic device such as a smartphone or the like includes a touch sensor at a display plane thereof. There are a variety of technologies to realize a touch sensor function. Recently, the touch sensor function has been realized by a projected capacitive system. A display device having the touch sensor function of the projected capacitive system is disclosed in, for example, Japanese Laid-Open Patent Publication No. 2016-81529.

SUMMARY

An embodiment of the present invention provides a display device including a first light emitting region emitting light toward a display plane; a second light emitting region emitting light toward the display plane, the second light emitting region being located at a position away from the first light emitting region by a first distance in a first direction; a third light emitting region emitting light toward the display plane, the third light emitting region being located at a position away from the second light emitting region by a second distance shorter than the first distance in the first direction; a first conductive portion located between the first light emitting region and the second light emitting region as seen from the display plane, the first conductive portion having a first width in the first direction, and a second conductive portion located between the second light emitting region and the third light emitting region as seen from the display plane, the second conductive portion having a second width shorter than the first width in the first direction.

BRIEF DESCRIPTION OF DRAWINGS

FIG. 2 shows a shape of sensor electrodes in embodiment 1 according to the present invention.

FIG. 8 shows a shape of a sensor electrode in embodiment 2 according to the present invention in detail.

DESCRIPTION OF EMBODIMENTS

Figure 1:
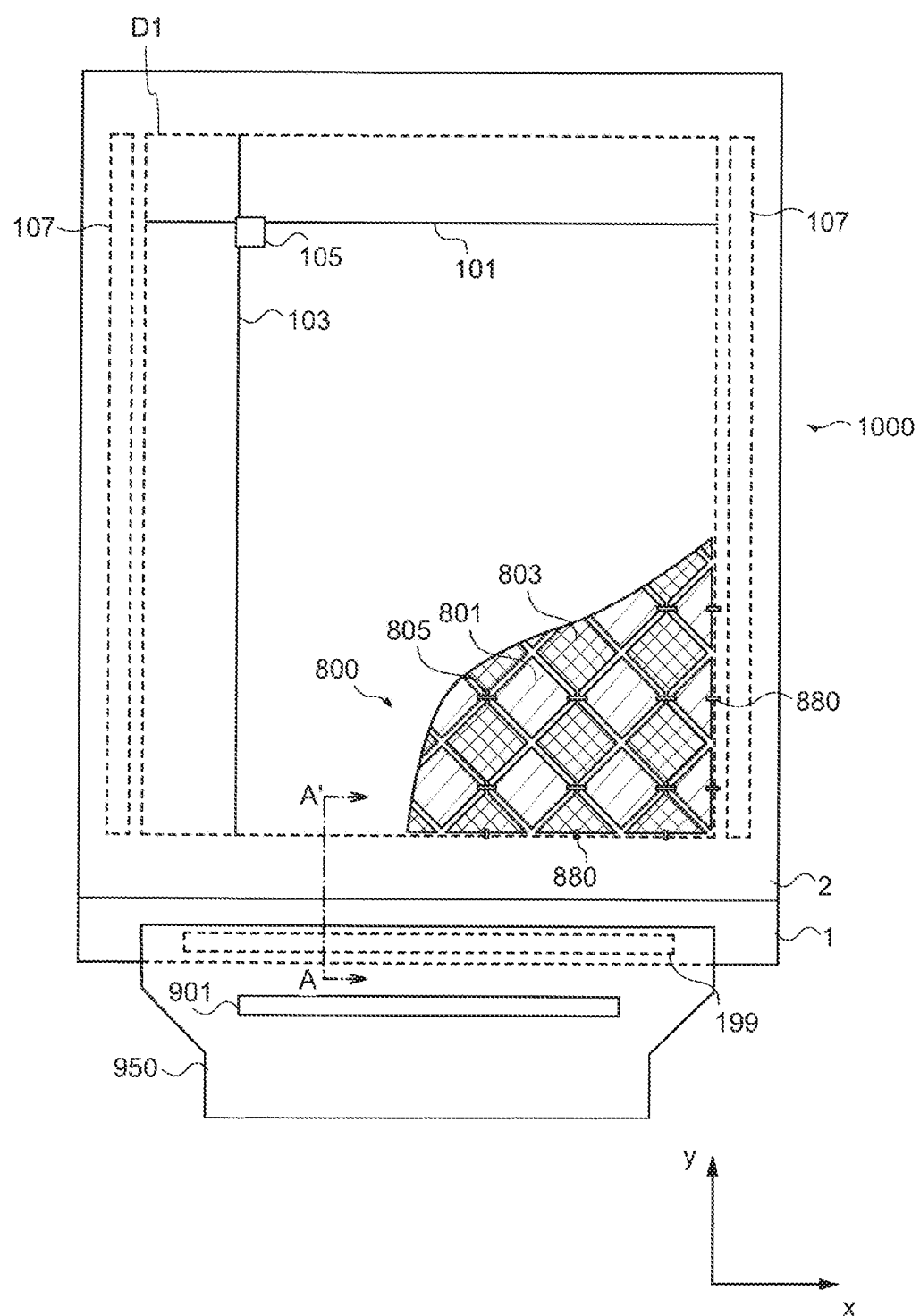
FIG. 1 shows a structure of a display device in embodiment 1 according to the present invention.

A display device having a touch sensor function includes, for example, a panel that provides display by an OLED (Organic Light Emitting Diode) and an electrode that realizes the touch sensor function on the side of a display plane (hereinafter, such an electrode will be referred to as a "sensor electrode"). The sensor electrode is provided at a position closer to the side on which light is output than the OLED, and therefore, is formed of a transparent conductive material. In the case of being highly light-blocking, the sensor electrode is located at such a position as not to prevent light emission of the OLED, or is formed to have such a shape as not to block light from the OLED. However, even in the case where the sensor electrode is located at such a position as not to block the light as seen in a direction perpendicular to the display plane, there may be a case where the sensor electrode blocks the light as seen in an oblique direction. In such a case, the brightness of the display plane is decreased.

Recently, pixels emitting light of various colors for color display may be located in a complicated arrangement instead of a so-called stripe arrangement or a delta arrangement. Therefore, the amount of light that is blocked by the sensor electrode may be different color by color in the case where the sensor electrode is located at a certain position. This may cause a problem regarding display that the ratio of the colors is changed and thus the tone of the display is changed.

An object of the present invention is to suppress, in a display device having a touch sensor function, a problem regarding display that is caused when the display is viewed in an oblique direction.

Hereinafter, embodiments of the present invention will be described with reference to the drawings. This disclosure is merely an example, and changes which would be ready conceivable by a person of ordinary skill in the art while including the gist of the present invention are naturally encompassed in the scope of the present invention. In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that are substantially the same as those described before with reference to a previous drawing(s) bear the identical reference signs thereto, and detailed descriptions thereof may be omitted.

In the detailed description of the present invention, an expression that a component is "on", "above" or "below" another component encompasses a case where such a component is in contact with the another component and also a case where still another component is provided between such a component and the another component, unless otherwise specified.

Embodiment 1

[General Structure]

A display device in an embodiment according to the present invention is an organic EL (Electro-Luminescence) display device including an OLED. In this example, the organic EL display device provides color display by a plurality of OLEDs each emitting light of different colors from each other. In this example, the plurality of OLEDs include an OLED emitting red (R) light, an OLED emitting green (G) light, and an OLED emitting blue (B) light.

The display device has a structure in which a first substrate and a second substrate are bonded together by a bonding member. The first substrate includes a driving element such as, for example, a thin film transistor (TFT) that controls a light emission state of each of the OLEDs. The second substrate acts as a cover that protects components provided in the first substrate. In the case where a cover layer is formed to directly cover the components provided in the first substrate, the second substrate acting as a cover does not need to be provided.

Light emitted from each of the OLEDs located in the first substrate is emitted to a side opposite to the first substrate and is visually recognized by a user through the second substrate. Namely, a display plane is provided on the side of the second substrate. Such a light extraction system is a so-called "top-emission system". The display device has a touch sensor function as described below. In this example, the touch sensor function detects a contact of a finger, a stylus or the like (in the following description, referred to collectively as the "finger") on the display plane by an electrostatic capacitance system, more specifically, by a mutual capacitance system. The finger and the display plane do not necessarily need to contact each other to be detected, and a predetermined distance may be provided between the finger and the display plane. Namely, the touch sensor detects a position on the display plane pointed to by the finger points.

[Structure of the Display Device]

FIG. 1 shows a structure of a display device 1000 in embodiment 1 according to the present invention. The display device 1000 includes a first substrate 1, a second substrate 2 bonded to the first substrate 1, and an FPC (Flexible Printed Circuit Board) 950 connected with a terminal region 199 of the first substrate 1. A plurality of connection terminals (not shown) are arrayed in the terminal region 199. A driver IC 901 is mounted on the FPC 950.

The first substrate 1 of the display device 1000 includes a display region D1 and a region in which a driving circuit 107 is located. The display region D1 includes scanning signal lines 101 extending in an x direction and data signal lines 103 extending in a y direction different from the x direction. The scanning signal lines 101 are arrayed in the y direction. The data signal lines 103 are arrayed in the x direction.

In this example, the x direction and the y direction cross each other perpendicularly. At each of positions at which the scanning signal lines 101 and the data signal lines 103 cross each other, a pixel 105 is located. Such pixels 105 are arrayed in the x direction and in the y direction. A specific positional arrangement of the pixels 105 in this example will be described below. In FIG. 1, one signal line extends in the x direction and one signal line extends in the y direction for one pixel 105. Alternatively, two signal lines may extend in the x direction and two signal lines may extend in the y direction for one pixel 105. In the display region D1, a line that supplies a predetermined voltage, such as a power source line or the like, may be located.

The driving circuit 107 is located along a periphery of the display region D1, and supplies a predetermined signal to the scanning signal lines 101. In this example, the driver IC 901 controls the driving circuit 107 based on a signal that is input from an external controller, and supplies a video signal or the like to the data signal lines 103. Any other driving circuit may further be provided around the display region D1.

Each pixel 105 includes a pixel circuit (not shown) and a display element (not shown) including a light emitting element (OLED). The pixel circuit includes, for example, a thin film transistor and a capacitor. The light emitting element includes a light emitting region that emits light under the control of the pixel circuit. In this example, the light emitting region of each pixel 105 emits red, green or blue light. The light emitting region is not limited to emitting red, green or blue light, and may emit light of any of various other colors.

The pixel circuit controls the light emission of the light emitting element by various signals including a control signal supplied to the corresponding scanning signal line 101, a video signal supplied to the corresponding data signal line 103, and the like. Under the control on the light emission, an image is displayed in the display region D1. The light from the light emitting element passes the second substrate 2 and thus is visually recognized by the user as an image on the side of the display plane.

A touch sensor 800 is located in the display region D1. In FIG. 1, only a part of the touch sensor 800 is shown for easier explanation of the relationship thereof with other components. The touch sensor 800 is located closer to the second substrate 2 than the light emitting region of the pixel 105. Therefore, the light from the light emitting element passes a layer including the touch sensor 800 and then passes the second substrate 2, and thus is visually recognized on the display plane by the user. The touch sensor 800 detects a change in the electrostatic capacitance between first sensor electrodes 801 and second sensor electrodes 803 to detect a position on the display plane pointed to by the finger. An extraction wiring 880 is provided to connect the first sensor electrodes 801 and the second sensor electrodes 803 to the connection terminals of the terminal region 199.

[Structure of the Sensor Electrode]

FIG. 2 shows a shape of the sensor electrodes in embodiment 1 according to the present invention. The first sensor electrodes 801 and the second sensor electrodes 803 each have an outer shape along an outer perimeter of a generally square shape having the x direction and the y direction as diagonal lines. The first sensor electrodes 801 and the second sensor electrodes 803 each have an opening at a position corresponding to the light emitting region. Namely, the first sensor electrodes 801 and the second sensor electrodes 803 are each formed of a so-called mesh-like conductive body located at a position corresponding to a region other than the light emitting region. In this example, the first sensor electrodes 801 are each formed of a light-blocking metal material, but the light from the light emitting region passes the opening toward the display plane. The second sensor electrodes 803 have substantially the same structure as that of the first sensor electrodes 801, namely, are each formed of a mesh-like conductive body.

Each two second sensor electrodes 803 adjacent to each other in the y direction are electrically connected with each other. By contrast, each two second sensor electrodes 803 adjacent to each other in the x direction are separate from each other. Each two first sensor electrodes 801 adjacent to each other in the x direction are electrically connected with each other via a connection electrode 805. By contrast, each two first sensor electrodes 801 adjacent to each other in the y direction are separate from each other. The touch sensor 800 finds a position at which the electrostatic capacitance between the first sensor electrodes 801 connected with each other in the x direction and the second sensor electrodes 803 connected with each other in the y direction has been changed, and thus detects a position pointed to by the finger. In FIG. 1 and FIG. 2, the connection electrodes 805 are located in a layer above the first sensor electrodes 801 and the second sensor electrodes 803, namely, closer to the second substrate 2 than the first sensor electrodes 801 and the second sensor electrodes 803. Alternatively, the connection electrodes 805 may be located in a layer below the first sensor electrodes 801 and the second sensor electrodes 803, namely, closer to the first substrate 1 than the first sensor electrodes 801 and the second sensor electrodes 803.

Figure 3:
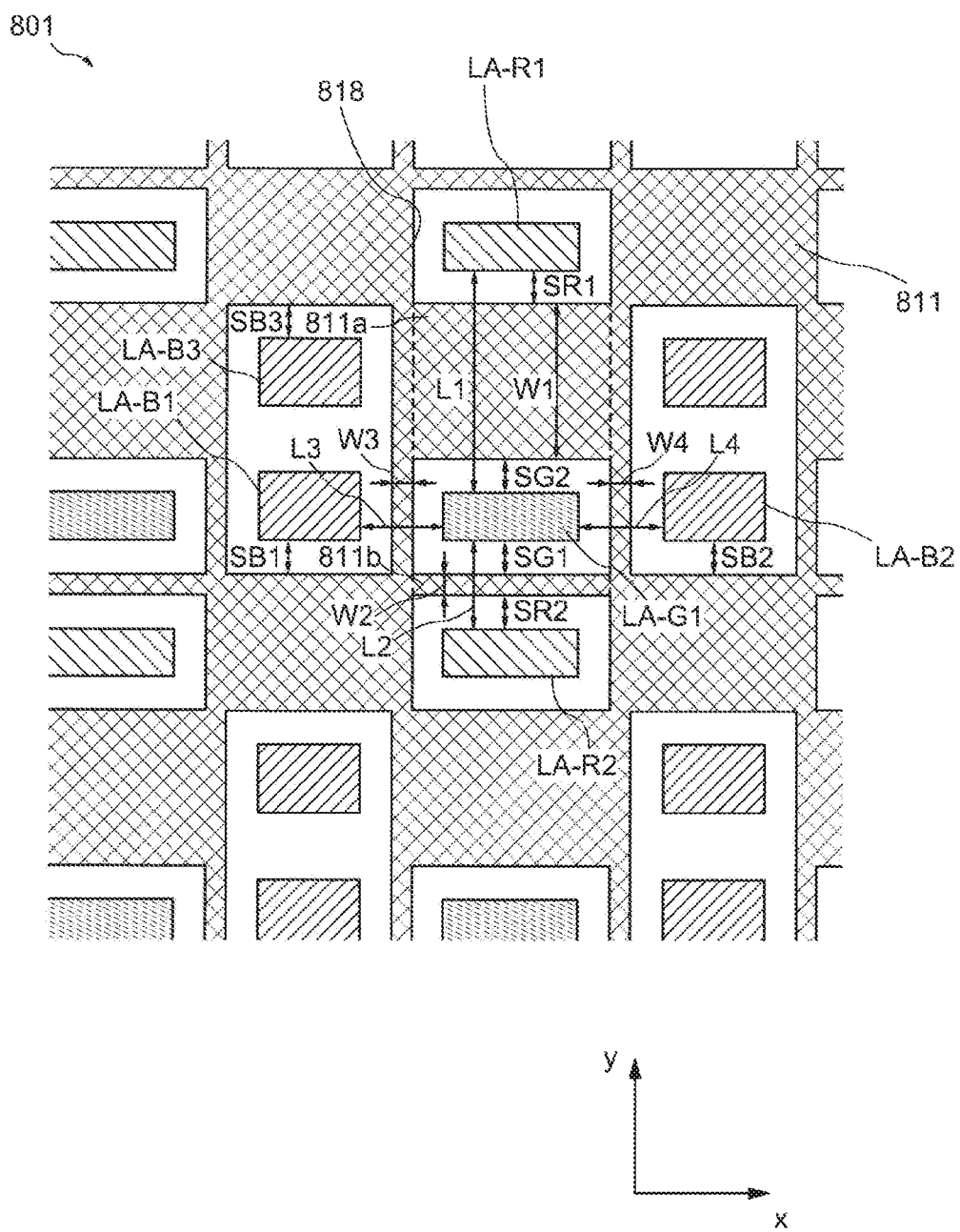
FIG. 3 shows the shape of one of the sensor electrodes in embodiment 1 according to the present invention in detail.

FIG. 3 shows the shape of one of the sensor electrodes in embodiment 1 according to the present invention in detail. FIG. 3 is an enlarged view of one first sensor electrode 801 shown in FIG. 2. FIG. 3 is enlarged such that the positional relationship between light emitting regions and the openings is understood as seen from the side of the display plane. The first sensor electrode 801 include a conductive portion 811 located to form openings 818. The openings 818 are formed to allow light from light emitting regions LA to pass toward the display plane. A light emitting region corresponding to red is represented as "LA-R", a light emitting region corresponding to green is represented as "LA-G", and a light emitting region corresponding to blue is represented as "LA-B".

In FIG. 3, for the sake of convenience, a light emitting region corresponding to green at a specific position is represented as "LA-G1" (second light emitting region). Light emitting regions corresponding to red adjacent to the light emitting region LA-G1 in the y direction are represented as "LA-R1" (first light emitting region) and "LA-R2" (third light emitting region). Light emitting regions corresponding to blue adjacent to the light emitting region LA-G1 in the x direction are represented as "LA-B1" and "LA-B2". A region of the conductive portion 811 that is located between the light emitting region LA-R1 and the light emitting region LA-G1 is defined as a first conductive portion 811a, and a region of the conductive portion 811 that is located between the light emitting region LA-R2 and the light emitting region LA-G1 is defined as a second conductive portion 811b. The first conductive portion 811a and the second conductive portion 811b are both parts of the same conductive portion 811, and therefore, are conductive to each other. In FIG. 3, the conductive portion 811 is not located between the light emitting region LA-B1 and a light emitting region LA-B3 adjacent to the light emitting region LA-B1 in the y direction. Alternatively, the conductive portion 811 may be located between the light emitting region LA-B1 and the light emitting region LA-B3 in the case where there is a certain distance between the light emitting regions LA-B1 and LA-B3.

The light emitting regions LA of the pixels 105 arrayed in the y direction are not located at an equal interval. In this example, distance L2 between the light emitting region LA-R2 and the light emitting region LA-G1 is shorter than distance L1 between the light emitting region LA-R1 and the light emitting region LA-G1. Width W2 of the second conductive portion 811b is shorter than width W1 of the first conductive portion 811a. Widths W1 and W2 correspond to lengths in the y direction, namely, lengths in the direction in which the light emitting regions LA-R1, LA-G1 and LA-R2 are arrayed. It is set such that as the distance between two light emitting regions LA adjacent to each other is shorter, the width of the conductive portion located between the two light emitting regions LA is shorter. Such a positional arrangement suppresses the change in the color ratio as seen in an oblique direction with respect to the display plane. A reason why such an effect is provided will be described below.

In this example, the distances, in the y direction, between the light emitting regions LA and the conductive region 811 are equal to each other. For example, distance SR1, distance SG1, distance SR2 and distance SG2 are equal to each other. Distance SR1 is a distance between the light emitting region LA-R1 and the first conductive portion 811a. Distance SG1 is a distance between the light emitting region LA-G1 and the second conductive portion 811b. Distance SR2 is a distance between the light emitting region LA-R2 and the second conductive portion 811b. Distance SG2 is a distance between the light emitting region LA-G1 and the first conductive portion 811a.

Alternatively, the distances may have the following relationship: distance SR1 and distance SG1 are equal to each other, distance SR2 and distance SG2 are equal to each other, and distance SR1 and distance SR2 are different from each other. Still alternatively, distance SR1, distance SG1, distance SR2 and distance SG2 may all be different from each other. Such a positional arrangement further suppresses the change in the color ratio as seen in an oblique direction with respect to the display plane. A reason why such an effect is provided will also be described below.

In this example, as seen in the x direction, distance L3 between the light emitting region LA-G1 and the light emitting region LA-B1, and distance L4 between the light emitting region LA-G1 and the light emitting region LA-B2, are equal to each other. Width W3 of a portion of the conductive portion 811 that is located between the light emitting region LA-G1 and the light emitting region LA-B1, and width W4 of a portion of the conductive portion 811 that is located between the light emitting region LA-G1 and the light emitting region LA-B2, are equal to each other. Widths W3 and width W4 correspond to lengths in the x direction of the conductive portion 811. In this example, the distances between the light emitting regions LA and the conductive portion 811 in the x direction are equal to each other. Alternatively, the distances do not need to be equal to each other.

[Cross-Sectional Structure of the Display Device]

Now, a cross-sectional structure of the display device 1000 in a region including a part of the display region D1 and the terminal region 199 shown in FIG. 1 will be described.

Figure 4:
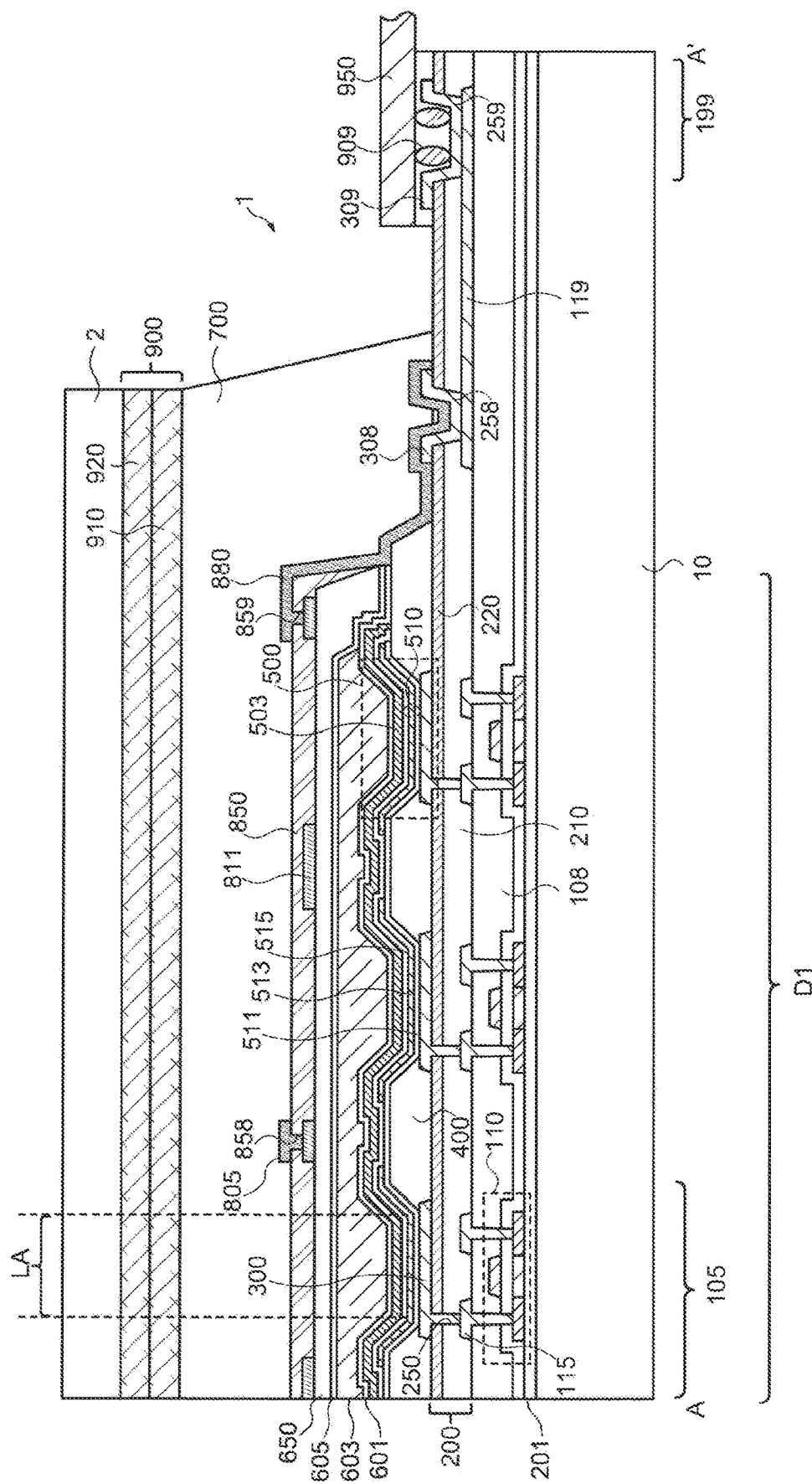
FIG. 4 is a schematic view showing a cross-sectional structure of the display device in embodiment 1 according to the present invention.

FIG. 4 is a schematic view showing a cross-sectional structure of the display device 1000 in embodiment 1 according to the present invention. The cross-sectional structure described below is along line A-A' in FIG. 1. A first support substrate 10 of the first substrate 1 and the second substrate 2 are each an organic resin substrate that is flexible. One of, or both of, the first support substrate 10 and the second substrate 2 may be a glass substrate.

A thin film transistor 110 is located on the first support substrate 10 while an insulating layer 201 formed of silicon oxide, silicon nitride or the like is located between the thin film transistor 110 and the first support substrate 10. A semiconductor layer of the thin film transistor 110 contains amorphous or crystalline silicon. The semiconductor layer may be formed of an oxide semiconductor.

Interlayer insulating layers 108 and 200 each having an insulating surface are located so as to cover the thin film transistor 110. A pixel electrode 300 is located on the interlayer insulating layer 200. In this example, the interlayer insulating layer 200 has a stack structure including an organic insulating layer 210 formed of acrylic resin or the like and an inorganic insulating layer 220 formed of a silicon nitride film (SiN) or the like. The inorganic insulating layer 220 is located closer to the pixel electrode 300 than the organic insulating layer 210.

The pixel electrode 300 is located in correspondence with each of the pixels 105, and is connected with a conductive layer 115 via a contact hole 250 provided in the interlayer insulating layer 200. The conductive layer 115 is connected with the thin film transistor 110 via the interlayer insulating layer 108. The conductive layer 115 has a stack structure in which, for example, an aluminum (Al) layer is held between titanium (Ti) layers. The pixel electrode 300 is used as an anode electrode of the OLED. The display device 1000 displays an image by a top-emission system, and therefore, the pixel electrode 300 does not need to be light-transmissive. In this example, the pixel electrode 300 includes a layer (e.g., silver-containing layer) that reflects light emitted by the OLED, and also includes a light-transmissive conductive metal oxide layer (formed of, for example, ITO (Indium Tin Oxide)) at a surface thereof in contact with the OLED.

A bank layer 400 covers an end of the pixel electrode 300 and a region between two adjacent pixels, and has an opening that exposes a part of the pixel electrode 300. In this example, the bank layer 400 is formed of an organic insulating material such as acrylic resin or the like.

A light emitting portion 510 is an OLED, and covers, and is in contact with, the pixel electrode 300 and a part of the bank layer 400. The light emitting portion 510 has a stack structure including layers of a plurality of types of organic materials. In this example, the light emitting portion 510 has a stack structure including a hole injection layer/transfer layer 510, a light emitting layer 513, and an electron injection layer/transfer layer 515. Between the pixels adjacent to each other and corresponding to different colors, the light emitting layer 513 is divided into a plurality of light emitting layers 513 on the bank layer 400. Such a plurality of the light emitting layers 513 have different compositions in accordance with the color of light to be emitted among red, green and blue.

A light-transmissive electrode 503 covers the light emitting portion 510 and acts as a cathode electrode (counter electrode to the pixel electrode 300) of the OLED. The light-transmissive electrode 503 transmits the light from the OLED, and is formed of, for example, a metal layer or the like that is sufficiently thin to transmit the light or of a transparent conductive metal oxide layer. A light emitting element 500 including the light emitting region LA includes the pixel electrode 300, the light emitting portion 510 and the light-transmissive electrode 503. The light emitting region LA corresponds to the part of the pixel electrode 300 that is exposed by the bank layer 400.

Sealing layers 601, 603 and 605 are provided to cover the light emitting element 500 and also cover the entirety of the display region to prevent moisture, gas or any other component that deteriorates the light emitting portion 510 from reaching the light emitting portion 510. In this example, the sealing layers 601 and 605 are each an inorganic insulating layer formed of silicon nitride or the like. The sealing layer 603 is an organic insulating layer held between the sealing layers 601 and 605 and formed of acrylic resin or the like. An organic insulating layer 650 covers the sealing layer 605. The organic insulating layer 650 may be omitted.

The conductive portion 811 is located on the organic insulating layer 650. The conductive portion 811 has a stack structure in which, for example, an aluminum (Al) layer is held between titanium (Ti) layers. The conductive portion 811 may contain another material, for example, molybdenum, tungsten, tantalum, chromium, copper, an alloy thereof, or the like. The conductive portion 811 may be formed of a metal material of a single-layer structure or a stack structure. The conductive portion 811 is formed of a light-blocking metal material. Alternatively, the conductive portion 811 may be formed of a material less light-blocking than the metal material (material more light-transmissive than the metal material), for example, a conductive metal oxide.

As described above, the conductive portion 811 is located in a mesh state and is included in each of the first sensor electrodes 801 and each of the second sensor electrodes 802. As can be seen, the conductive portion 811 included in each first sensor electrode 801 and the conductive portion 811 included in each second sensor electrode 803 are located in the same layer in contact with a surface of one, same insulating layer (in this example, the organic insulating layer 650). Namely, the first sensor electrodes 801 and the second sensor electrodes 803 have the conductive portions 811 formed in the same step. An insulating layer 850 covers the conductive portion 811. The insulating layer 850 includes an inorganic insulating layer formed of a silicon oxide film or a silicon nitride film.

The connection electrode 805 is located on the insulating layer 850, and is connected with the conductive portion 811 via a contact hole 858 formed in the insulating layer 850. As described above, the connection electrode 805 is connected with a part of the conductive portion 811 so as to connect the first sensor electrodes 801 adjacent to each other. The extraction wiring 880 is located on the insulating layer 850, and is connected with the conductive portion 811 via a contact hole 859 formed in the insulating layer 850. The connection electrode 805 and the extraction wiring 880 are in the same layer and are both on the insulating layer 850. The connection electrode 805 and the extraction wiring 880 may be formed of the same material as that of the conductive portion 811, or a different material from that of the conductive portion 811. The positional relationship of the conductive portion 811 and the connection electrode 805 in the up-down direction may be opposite to that shown in FIG. 4. It is preferred that the extraction wiring 880 is formed of an upper conductive layer among the layer used to form the conductive portion 811 and the layer used to form the connection electrode 805.

The extraction wiring 880 is electrically connected with a terminal wiring 119 covered with a protective electrode 308 via a contact hole 258 formed in the interlayer insulating layer 200. The protective electrode 308 may be formed of the same material as that of the pixel electrode 300. A part of the terminal wiring 119 that is exposed by the contact hole 259 is covered with a protective electrode 309. Such a covered part is a part of the connection terminals in the terminal wiring 199. The FPC 950 is electrically connected with the connection terminal via an anisotropic conductive layer 909.

An organic protective film 700 is provided to fill a gap between the first substrate 1 and the second substrate 2 to bond the first substrate 1 and the second substrate 2, and is formed of, for example, acrylic resin, which is light-transmissive. In this example, a circularly polarizing plate 900 is located between the second substrate 2 and the organic protective film 700. The circularly polarizing plate 900 has a stack structure including a quarter-wave plate 910 and a linearly polarizing plate 920. Such a structure allows the light from the light emitting region LA to be output to the outside from a display plane DS of the second substrate 2. The cross-sectional structure of the display device 1000 is as described above.

[Influence of the Sensor Electrode on the Light Emission]

Now, an influence exerted by the conductive portion 811 in each of the first sensor electrodes 801 and the second sensor electrodes 803 on the light from the light emitting region LA (light blocking state provided by the conductive portion 811) will be described.

Figure 5:
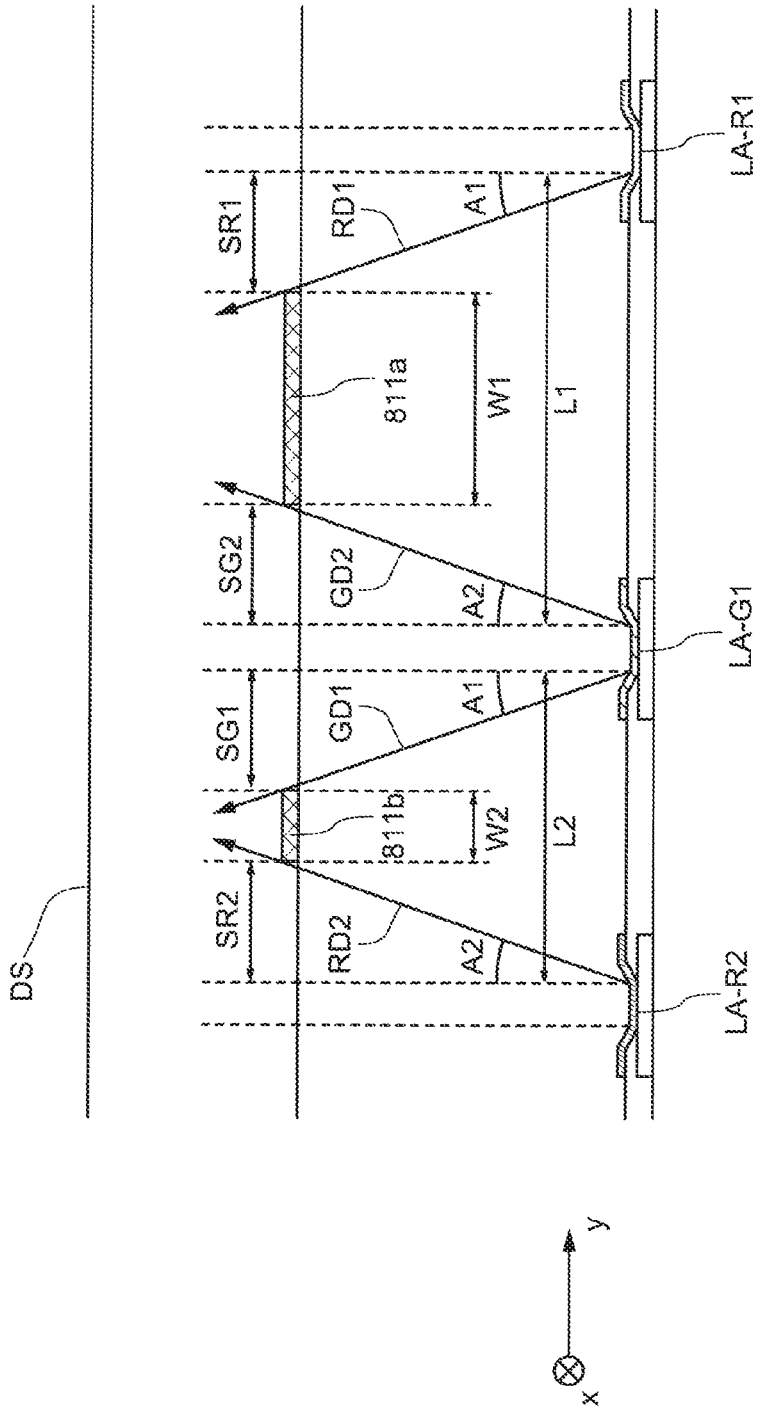
FIG. 5 shows a light blocking state provided by the sensor electrode in embodiment 1 according to the present invention.

FIG. 5 shows a light blocking state provided by the sensor electrode in embodiment 1 according to the present invention. FIG. 5 shows a cross-sectional structure of the display device 1000, especially, the positional relationship between the light emitting region LA and the conductive portion 811. The light from each light emitting region LA is directed toward the display plane DS with a predetermined expansion. The directed light is partially blocked by the conductive portion 811 (the first conductive portion 811a or the second conductive portion 811b).

For example, among light components directed from the light emitting region LA-G1, a light component expanding outer to a direction GD1 having angle A1 with respect to the front direction (direction having a larger angle than angle A1) is blocked by the second conductive portion 811b. Among light components directed from the light emitting region LA-R1, a light component expanding outer to a direction RD1 having angle A1 with respect to the front direction (direction having a larger angle than angle A1) is blocked by the first conductive portion 811a.

In FIG. 5, distance SR1 between the light emitting region LA-R1 and the first conductive portion 811a, and distance SG1 between the light emitting region LA-G1 and the second conductive portion 811b, are equal to each other. Therefore, in the case where the user visually recognizes the light at angles gradually changing from the direction vertical to the display plane DS, the light reaching the user from the light emitting region LA-G1 and the light reaching the user from the light emitting region LA-R1 are decreased in the same manner by the influence of the first conductive portion 811a and the second conductive portion 811b. The distance between the light emitting region and the conductive portion is set to be equal for all the colors. Therefore, when the angle exceeds angle A1, which is generally the same for all the colors, the amount of the light of all the colors is significantly decreased. For this reason, this structure suppresses the change in the color ratio of at least the green light and the red light as seen from an oblique direction.

For the relationship between the blue light emitting regions LA-B and the conductive portion 811, the positional relationship is set in substantially the same manner, and therefore, the color ratio of blue and another color is suppressed from changing. For example, as shown in FIG. 3, distance SB1 between the light emitting region LA-B1 and the conductive portion 811 in the y direction may be made equal to distance SG1 or distance SR1. The same is applicable to distance SB2 between the light emitting region LA-B2 and the conductive portion 811 in the y direction. Distance SB3 between the light emitting region LA-B3 and the conductive portion 811 in the y direction may be made equal to distance SG2 or distance SR2.

The same is applicable to angle A2 in a direction opposite to that of angle A1. More specifically, among the light components directed from the light emitting region LA-G1, a light component expanding outer to a direction GD2 having angle A2 with respect to the front direction (direction having a larger angle than angle A2) is blocked by the first conductive portion 811a. Among light components directed from the light emitting region LA-R2, a light component expanding outer to a direction RD2 having angle A2 with respect to the front direction (direction having a larger angle than angle A2) is blocked by the second conductive portion 811b. This phenomenon occurs because distance SG2 and distance SR2 are equal to each other.

Distance SG1 and distance SG2 do not need to be equal to each other. Distance SR1 and distance SR2 do not need to be equal to each other. For example, regarding a color, among R, G and B, for which a luminance change is easily recognizable, the distance between the light emitting region LA and the conductive portion may be made longer, so as to decrease the range of angles in which the light is blocked. Distance SG1, distance SG2, distance SR1 and distance SR2 may be equal to each other. In this case, angle A1 and angle A2 have an equal absolute value.

Distance SG1 and distance SR1 are not limited to being equal to each other. Distance SG2 and distance SR2 are not limited to being equal to each other. In the case where distance SG1 and distance SR1 are different from each other, or in the case where distance SG2 and distance SR2 are different from each other, the range of angles in which the light of one of the colors is blocked is increased, and thus the color ratio may be changed, in a predetermined range of angles. However, as the distance between two light emitting regions LA is shorter, the width of the conductive portion 811 located between the two light emitting regions LA is shorter. Namely, in this example, as long as the condition that width W2 is shorter than width W1 is fulfilled, the range of angles in which the color ratio is changed is decreased as compared with in the comparative example described below.

In the case where the conductive portion 811 is formed of a light-blocking material, the influence of decreasing the amount of light is large as seen in an oblique direction. Nonetheless, even if the conductive portion 811 is formed of a light-transmissive material, the amount of light is decreased in accordance with the transmittance. Therefore, the above-described effect is provided even if the conductive portion 811 is not formed of a highly light-blocking material such as a metal material or the like.

Comparative Example

Now, a comparative example will be described in order to make the features of embodiment 1 easier to understand.

Figure 6:
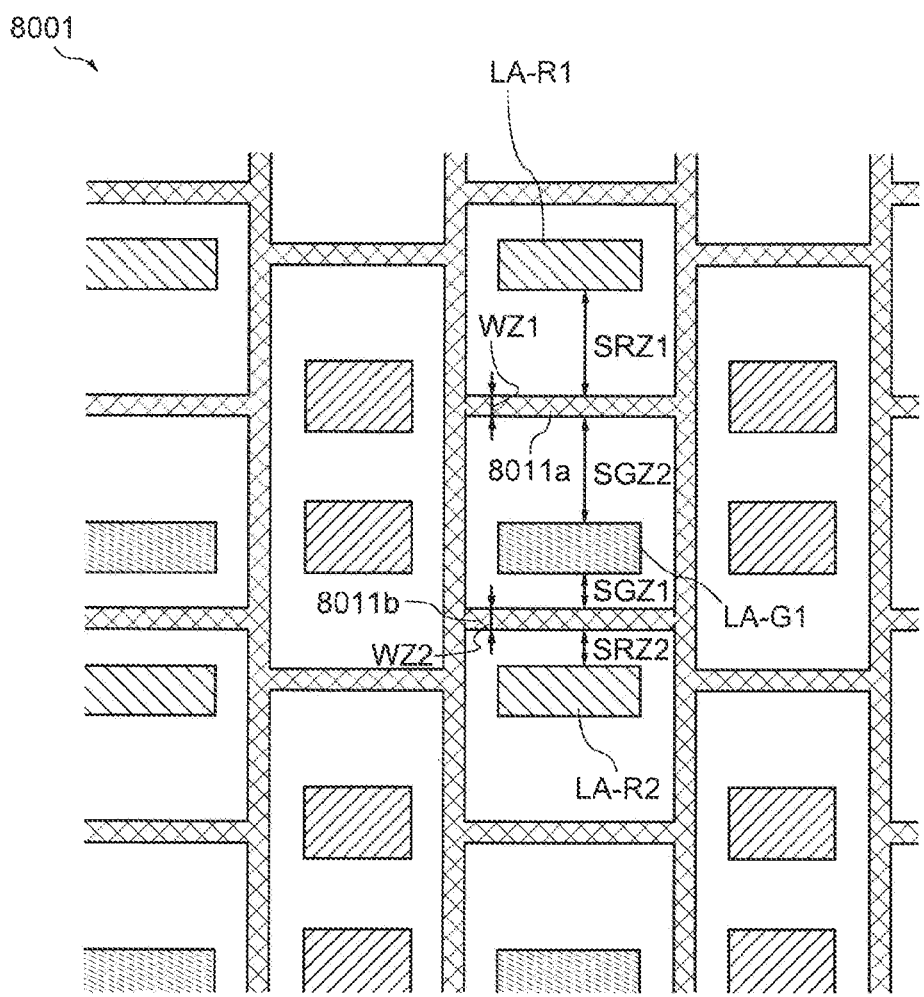
FIG. 6 shows a shape of a sensor electrode in a comparative example in detail.

FIG. 6 is a view showing a shape of a sensor electrode in a comparative example in detail. FIG. 6 corresponds to FIG. 3. In the sensor electrode of the comparative example, conductive bodies are each located at a center of a region between light emitting regions LA and have an equal width to each other. For example, as shown in FIG. 6, in a conductive portion 8011 in a first sensor electrode 8001, width ZW1 of a first conductive portion 8011a and width WZ2 of a second conductive portion 8011b are equal to each other. In this manner, the conductive portions have an equal width regardless of the positions thereof. Distance SRZ1 and distance SGZ2 are equal to each other, and distance SRZ2 and distance SGZ1 are equal to each other. Now, an influence exerted by the conductive portion 8011 in the comparative example on the light from the light emitting region LA (light blocking state provided by the conductive portion 8011) will be described.

Figure 7:
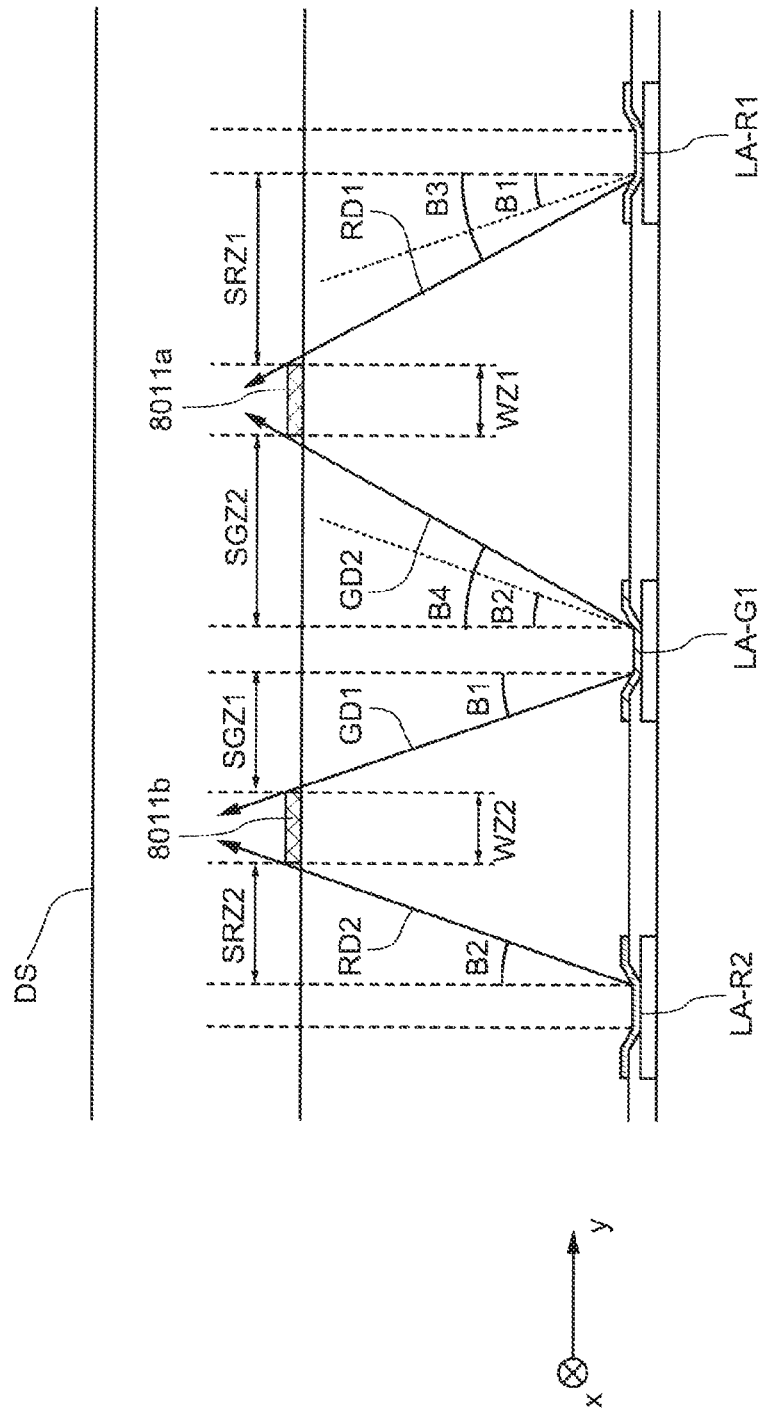
FIG. 7 shows a light blocking state provided by the sensor electrode in the comparative example.

FIG. 7 shows a light blocking state provided by the sensor electrode in comparative example. FIG. 7 corresponds to FIG. 5. In this example, among the light components directed from the light emitting region LA-G1, a light component expanding outer to the direction GD1 having angle B1 with respect to the front direction is blocked by the second conductive portion 8011*b*. Among the light components directed from the light emitting region LA-R1, a light component expanding outer to the direction RD1 having angle B3 with respect to the front direction is blocked by the first conductive portion 8011*a*. Angle B3 is larger than angle B1. Therefore, in the case where the light expands outer to the direction having angle B1 but inner to the direction having angle B3 with respect to the front direction, the light directed from the light emitting region LA-G1 is blocked, whereas the light directed from the light emitting region LA-R1 is not blocked. For this reason, in the case where the light expands outer to the direction having angle B1 but inner to the direction having angle B3 with respect to the front direction, only the light from the light emitting region LA-G1 is decreased, and the color visually recognized by the user is changed.

The same is applicable to angles B2 and B4 in a direction opposite to that of angles B1 and B3. Namely, among the light components directed from the light emitting region LA-R2, a light component expanding outer to the direction RD2 having angle B2 with respect to the front direction is blocked by the second conductive portion 8011*b*. Among the light components directed from the light emitting region LA-G1, a light component expanding outer to a direction GD2 having angle B4 with respect to the front direction is blocked by the first conductive portion 8011*a*. Angle B4 is larger than angle B2. Therefore, in the case where the light expands outer to the direction having angle B2 but inner to the direction having angle B4 with respect to the front direction, the light directed from the light emitting region LA-R2 is blocked, whereas the light directed from the light emitting region LA-G1 is not blocked. For this reason, in the case where the light expands outer to the direction having angle B2 but inner to the direction having angle B4 with respect to the front direction, only the light from the light emitting region LA-R2 is decreased, and the color visually recognized by the user is changed.

As described above, in embodiment 1, the width of the conductive portion is made shorter as the distance between two adjacent light emitting regions LA is shorter. As a result, the range of angles in which the color ratio is different as seen in an oblique direction is made smaller than in the comparative example. Especially, distance SG1, distance SR1 and distance SB1 are made equal to each other, or distance SG2, distance SR2 and distance SB2 are made equal to each other. Thus, the range of angles in which the color ratio is different in the case where the display plane DS is seen in an oblique direction along the y direction is minimized. Regarding the x direction, substantially the same effect is provided by setting the relationship between the light emitting regions LA and the conductive portion 811 in substantially the same manner as regarding the y direction.

Embodiment 2

In embodiment 1, the conductive portion 811 is located in all the regions between the light emitting regions LA adjacent to each other and emitting different colors of light from each other. In a first sensor electrode 801A described in embodiment 2, the conductive portion 811 is not located in a part of the regions between the light emitting regions LA. The second sensor electrode has substantially the same structure as that of the first sensor electrode 801A, and thus will not be described.

FIG. 8 shows a shape of the sensor electrode 801A in embodiment 2 in detail. In embodiment 2, the distances between the light emitting regions LA and a conductive portion 811A in the y direction are longer than in embodiment 1. For example, distance SRA1 between the light emitting region LA-R1 and a first conductive portion 811Aa is longer than distance SR1 in embodiment 1. Similarly, distance SGA2 between the light emitting region LA-G1 and the first conductive portion 811Aa is longer than distance SG2 in embodiment 1. Distance L1 between the light emitting region LA-G1 and the light emitting region LA-R1 is equal to that in embodiment 1. Therefore, width W1 of the first conductive portion 811Aa is shorter than W1 of the first conductive portion 811*a* in embodiment 1.

In the case where distance SG1 and distance SR2 in embodiment 1 are respectively replaced with distance SGA2 and distance SRA1 to be applied to embodiment 2, width W2 of the second conductive portion 811*b* is 0 or shorter. Therefore, in embodiment 2, there is no component corresponding to the second conductive portion 811*b*. Namely, the conductive portion 811A is not located between the light emitting region LA-G1 and the light emitting region LA-R2. As can be seen, the conductive portion 811A does not need to be present in a part of the regions between the light emitting regions LA.

A person of ordinary skill in the art would conceive various modifications and alterations within the scope of the idea of the present invention. These modifications and alterations are construed as being encompassed in the scope of the present invention. For example, the above-described embodiments may each have an element added thereto, or deleted therefrom, or may be changed in design optionally by a person of ordinary skill in the art, or may each have a step added thereto, or deleted therefrom, or may be changed in the condition optionally by a person of ordinary skill in the art. Such modifications or alterations are encompassed in the scope of the present invention as long as including the gist of the present invention.

What is claimed is:

1. A display device, comprising:
   a first light emitting region emitting light toward a display plane;
   a second light emitting region emitting light toward the display plane, the second light emitting region being located at a position away from the first light emitting region by a first distance in a first direction;
   a third light emitting region emitting light toward the display plane, the third light emitting region being located at a position away from the second light emitting region by a second distance shorter than the first distance in the first direction;
   a first conductive portion located between the first light emitting region and the second light emitting region as seen from the display plane, the first conductive portion having a first width in the first direction, and
   a second conductive portion located between the second light emitting region and the third light emitting region as seen from the display plane, the second conductive portion having a second width shorter than the first width in the first direction.

2. The display device according to claim 1, wherein as seen from the display plane, a distance between the first light emitting region and the first conductive portion and a distance between the second light emitting region and the second conductive portion is equal to each other.

3. The display device according to claim 2, wherein as seen from the display plane, a distance between the second light emitting region and the first conductive portion and a distance between the third light emitting region and the second conductive portion is equal to each other.

4. The display device according to claim 1, wherein at least one of the first light emitting region, the second light emitting region and the third light emitting region emits light of a color different from a color of light emitted by the remaining light emitting region(s) among the first light emitting region, the second light emitting region and the third light emitting region.

5. The display device according to claim 1, wherein the first light emitting region emits light of a color that is the same as a color of light emitted by the third light emitting region and is different from a color of light emitted by the second light emitting region.

6. The display device according to claim 1, wherein the first conductive portion and the second conductive portion are conductive to each other.

7. The display device according to claim 1, wherein the first conductive portion and the second conductive portion each form a part of an electrode of a touch sensor.

8. The display device according to claim 1, wherein the first conductive portion and the second conductive portion have light-blocking property.

9. The display device according to claim 1, wherein the first conductive portion and the second conductive portion are located on, and are in contact with, a surface of one, same insulating layer covering the first light emitting region, the second light emitting region and the third light emitting region.

* * * * *